US006952022B2

(12) United States Patent
Jang et al.

(10) Patent No.: US 6,952,022 B2
(45) Date of Patent: Oct. 4, 2005

(54) IMAGE SENSOR COMPRISING THIN FILM TRANSISTOR OPTICAL SENSOR HAVING OFFSET REGION

(75) Inventors: Jin Jang, Seoul (KR); Ji Ho Hur, Seoul (KR); Hyun Chul Nam, Seoul (KR)

(73) Assignee: Silicon Display Technology, Seoul (KR)

( * ) Notice: Subject to any disclaimer, the term of this patent is extended or adjusted under 35 U.S.C. 154(b) by 0 days.

(21) Appl. No.: 10/732,320

(22) Filed: Dec. 9, 2003

(65) Prior Publication Data

US 2005/0029611 A1 Feb. 10, 2005

(30) Foreign Application Priority Data

Aug. 6, 2003  (KR) ................................ 10-2003-0054468

(51) Int. Cl.[7] .............................................. H01L 29/04
(52) U.S. Cl. ............................ 257/59; 257/52; 257/72; 257/294; 257/451; 257/749
(58) Field of Search ........................... 257/2–5, 16, 72, 257/52–63, 88–93, 294, 749, 449–457, 646

(56) References Cited

U.S. PATENT DOCUMENTS 6,445,003 B1 * 9/2002 Chang et al. .................. 257/59

6,570,197 B2 * 5/2003 Joo ............................. 257/222

OTHER PUBLICATIONS

Korean Patent Abstract (Korean Publication No. 1020010035260, publication date May 7, 2001).
Korean Patent Abstract (Korean Publication No. 1020010088443, publication date Sep. 26, 2001).

* cited by examiner

*Primary Examiner*—Andy Huynh
(74) *Attorney, Agent, or Firm*—Morgan & Finnegan LLP

(57) ABSTRACT

The present invention relates to an image sensor comprising an amorphous silicon thin-film transistor optical sensor which functions as an image sensor used for an X-ray photography device, a fingerprint recognition apparatus, a scanner, etc., and a method of manufacturing the image sensor. Since the thin-film transistor optical sensor according to the present invention has a high-resistance silicon region by disposing an offset region in a channel region, a dark leakage current of the optical sensor remains in a low level even under a high voltage. Therefore, it is possible to apply a high voltage to the thin-film transistor optical sensor according to the present invention so that the image senor can be sensitive to a weak light. In addition, since the storage capacitance in the image sensor is formed in a double structure, the image sensor has a high value of capacitance. Furthermore, since a lower common electrode is electrically connected to an upper common electrode, the image sensor has a stable structure.

7 Claims, 7 Drawing Sheets

IMAGE SENSOR COMPRISING THIN FILM TRANSISTOR OPTICAL SENSOR HAVING OFFSET REGION

FIELD OF THE INVENTION

The present invention relates to an image sensor comprising a thin-film transistor optical sensor having an offset region and a method of manufacturing the image sensor, and more particularly, to an image sensor comprising an amorphous silicon thin-film transistor optical sensor which used for a fingerprint recognition apparatus, an X-ray photography device, etc., and a method of manufacturing the image sensor.

BACKGROUND OF THE INVENTION

Conventionally, thin-film transistor optical sensors have been used for an electro optical apparatus such as a photocopier or a facsimile. Recently, X-ray image sensors have been developed as display devices related to a hospital information automation system such as PACS (Picture Archiving Communication System).

FIG. 1 is a cross sectional view illustrating an image sensor comprising a conventional thin-film transistor optical sensor. Referring to FIG. 1, a gate electrode 22a of a switching thin-film transistor, a lower common electrode 29a, and a gate electrode 22b of an optical sensor are formed to be separated from each other on an insulating substrate 21. A gate insulating film 23 is deposited above the gate electrode 22a, the lower common electrode 29a and the gate electrode 22b.

A protective insulating film 27 is disposed above the gate insulating film 23. An intrinsic amorphous silicon layer 24, an N type amorphous silicon layer 25, a drain electrode 26a and a source electrode 26b of the thin-film transistor, a connection portion 26c, and a pixel electrode 26d and a power source electrode 26e of the optical sensor are disposed between the gate insulating film 23 and the protective insulating film 27. In addition, a metal light shielding film 28a is deposited above the right portion of the protective insulating film 27.

In addition, the gate electrode 22b of the optical sensor are commonly connected to gate electrodes of the image sensors in the adjacent array, and a storage capacitor is formed between the pixel electrode 26d and the lower common electrode 29a.

At the time of the operation of the optical sensor comprising the conventional amorphous thin-film transistor having the above structure, a negative voltage is applied to the gate electrode 22b of the optical sensor to minimize the dark leakage current of the optical sensor. However, there is a problem that, in a high voltage of 10V or more, the dark leakage current is too high to implement a high voltage driving. In addition, since the gate electrode 22b of the optical sensor is overlapped by the upper power source electrode, there is another problem that, in a high power source voltage of 20V or more, the dark leakage current is increasing, so that the dynamic range, a region on which lightness and darkness are able to be distinguished, is reduced.

In addition, as shown in FIG. 2, when the negative voltage is applied to the gate electrode 22b of the conventional amorphous silicon thin-film transistor optical sensor, holes are accumulated in an intrinsic semiconductor layer 24 to form a portion 31 which exhibits properties of a P type amorphous silicon. The gate electrode 22b is overlapped by the pixel electrode 26d and the power source electrode 26e in the optical sensor to form an N-P-N contact together with an N type amorphous silicon 25 so that the dark leakage current can be reduced. However, when a higher voltage is applied to the pixel electrode 26d, a strong electric field is formed between the N type layer and the P type layer, and then a depletion layer is narrowed. Like this, if the depletion layer is narrowed, there is still another problem that a large amount of the leakage current is generated. Because of the above problems, the optical sensor having the conventional structure is not suitable for its high voltage usage.

FIG. 3 is a graph illustrating a relationship between a drain current and a dark leakage current at the time that light is incident on a gate electrode of the conventional thin-film transistor optical sensor. In case of the conventional thin-film transistor optical sensor, when the gate electrode of the optical sensor ranges from −15V to −5V and the power source voltage of the optical sensor is a low voltage of 10V or less, the dark leakage current of the optical sensor is increased up to about $10^{-8}$ A.

Like this, the image sensor comprising the conventional silicon thin-film transistor optical sensor has the problem that the dark leakage current is increasing when a high voltage is applied.

SUMMARY OF THE INVENTION

In order to solve the above-mentioned problems, an object of the present invention is to provide an image sensor comprising an amorphous silicon thin-film transistor optical sensor capable of reducing a dark leakage current and a method of manufacturing the image sensor.

Another object of the present invention is to provide an image sensor comprising an amorphous silicon thin-film transistor optical sensor capable of preventing a dark leakage current from increasing in a high voltage of 20V or more and a method of manufacturing the image sensor.

Still another object of the present invention is to provide an image sensor comprising an amorphous silicon thin-film transistor optical sensor capable of controlling a dark leakage current so that the optical sensor can be insensitive to change of a gate voltage of the optical sensor and a method of manufacturing the image sensor.

Further still another object of the present invention is to provide an image sensor comprising an amorphous silicon thin-film transistor optical sensor having electrostatic stability and high storage capacitance by electrically connecting a lower common electrode to an upper common electrode through a via hole and a method of manufacturing the image sensor.

An aspect of the present invention is an image sensor comprising an amorphous silicon thin-film transistor optical sensor which is formed on an insulating substrate characterized in that an amorphous silicon thin-film transistor on the insulating substrate is used as a switching device and an amorphous silicon thin-film transistor having an offset region is used as an optical sensor.

In order to solve the above-mentioned problems, in the optical sensor according to the present invention, at least one offset region is formed between a pixel electrode and a power source electrode in the optical sensor, and the offset region is formed so that a second gate electrode is not overlapped by the pixel electrode or the power source electrode.

Moreover, in order to solve the above-mentioned problems, in the aspect of the present invention, the optical sensor may be an amorphous silicon thin-film transistor optical sensor.

Furthermore, in order to solve the above-mentioned problems, in the aspect of the present invention, a length of the offset region may be in a range of 1 µm to 10 µm.

DETAILED DESCRIPTION OF THE PREFERRED EMBODIMENTS

Now, the present invention will be described in detail with reference to the accompanying drawings.

Figure 1:
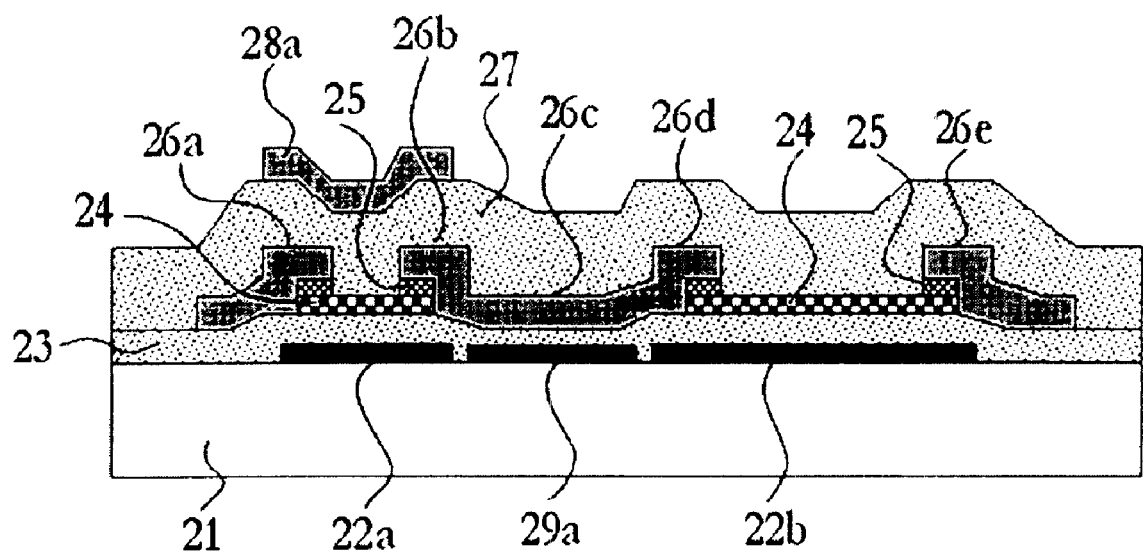
FIG. 1 is a cross sectional view illustrating an image sensor comprising a conventional thin-film transistor optical sensor.
Figure 2:
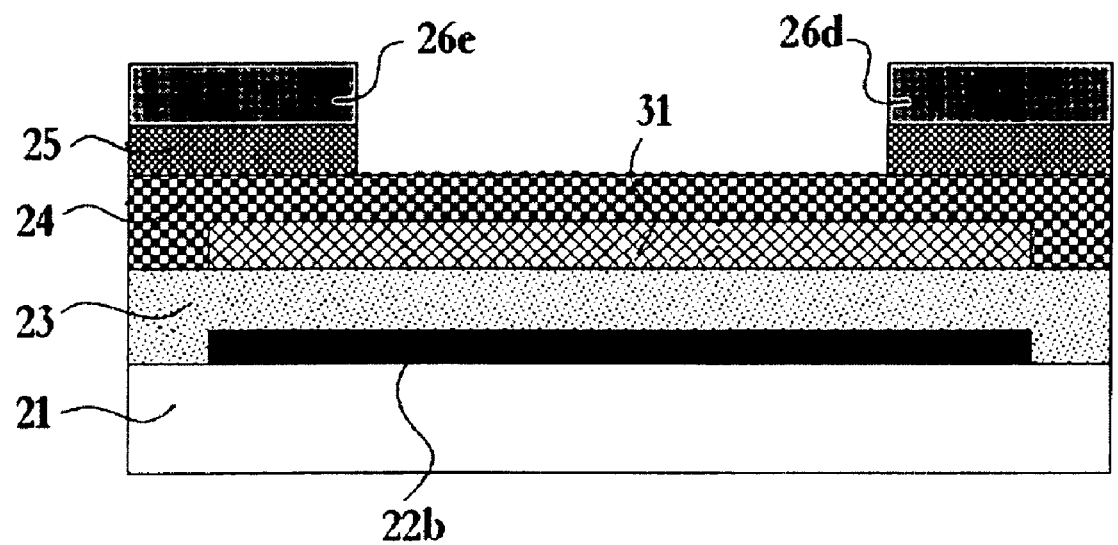
FIG. 2 is a schematic view illustrating a region in which holes are accumulated at the time that a negative voltage is applied to a gate electrode of the conventional thin-film transistor optical sensor.
Figure 3:
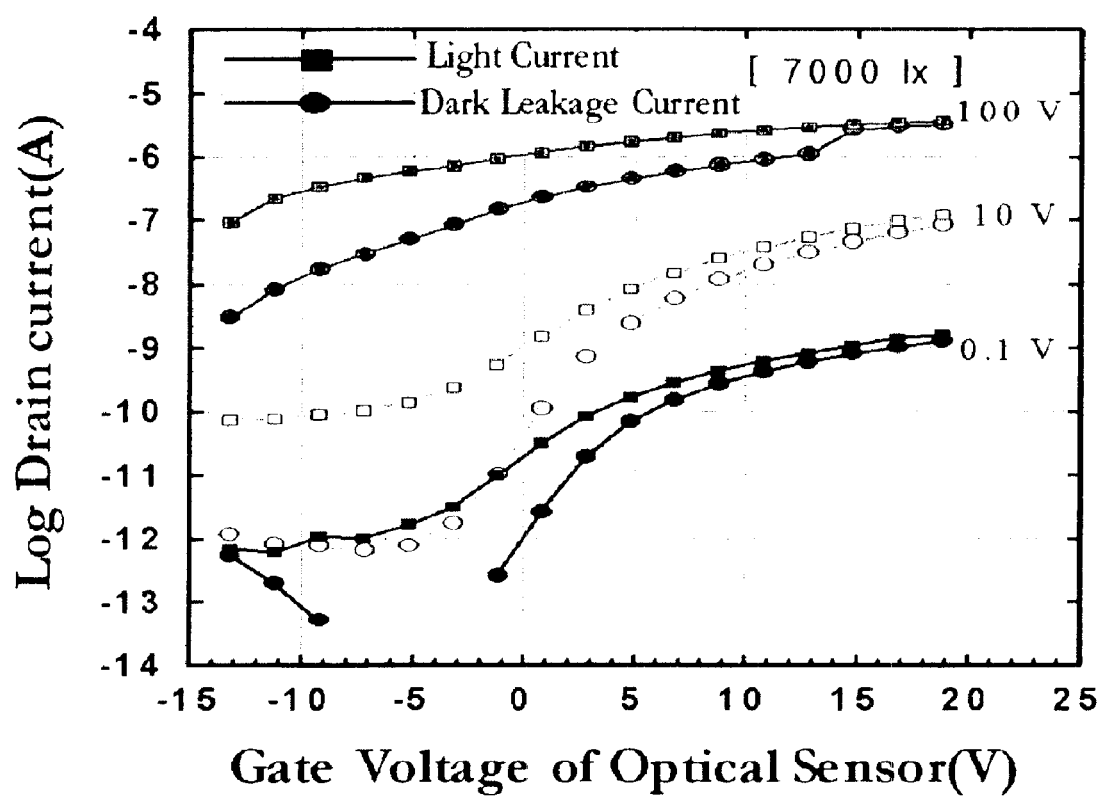
FIG. 3 is a graph illustrating a relationship between a drain current and a dark leakage current at the time that light is incident on a gate electrode of the conventional thin-film transistor optical sensor.
Figure 4:
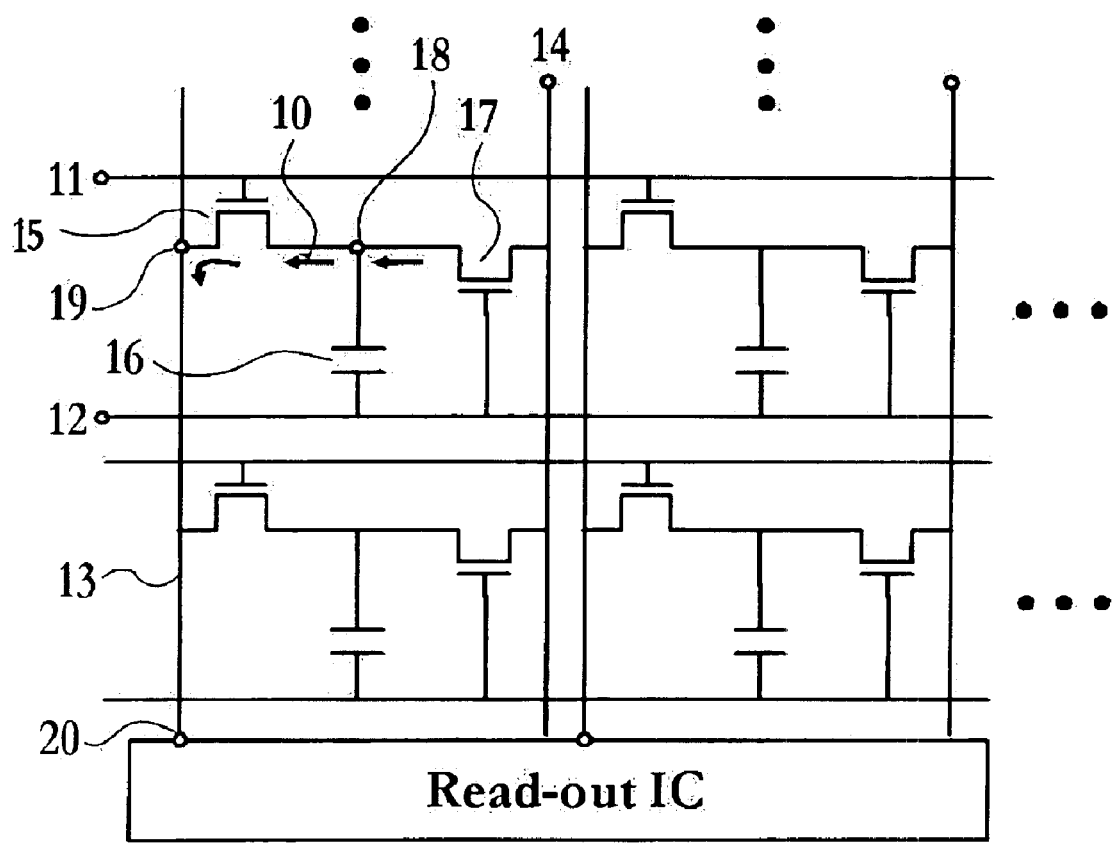
FIG. 4 is an equivalent circuit diagram illustrating an image sensor comprising a thin-film transistor optical sensor according to the present invention.

Referring to FIG. 4, the image sensor according to the present invention is operated as follows.

An output terminal 18 of an optical sensor 17 is connected to a storage capacitor 16 and a switching thin-film transistor 15. An output terminal 19 of the switching thin-film transistor 15 is connected to an external read-out IC 20 through a data bus line 13. In addition, a power source voltage of the optical sensor 17 is applied to the optical sensor 17 through a power source bus line 14. A gate electrode 22b of the optical sensor is connected to a common electrode line 12 to remain in its voltage range of −5V to −10V so that a dark leakage current of the optical sensor can be minimized.

When a positive voltage is applied to a gate electrode 11 of the switching thin-film transistor associated with a selected line, a light signal is converted into a light current 10 having a current amount corresponding to a degree of light intensity by the optical sensor, and the light current 10 is transferred to the read-out IC through the switching thin-film transistor.

On the other hand, the switching thin-film transistor associated with a non-selected line prevents the current from flowing, and then, the signal of the optical sensor is not transferred externally. By doing so, it is possible to avoid the mixing of signals between the lines and store the light current generated from the optical sensor in the storage capacitor 16 without any loss of the light current.

Charges stored in the storage capacitor 16 are distributed into the data bus lines and the read-out IC when the switching thin transistor is turned on. In addition, the charges stored in the storage capacitor 16 are input to the input terminal 20 of the read-out IC as a corresponding voltage value.

At that time, if reduction of a noise effect is intended by applying a high input voltage to the input terminal 20 of the read-out IC, a large amount of currents is needed.

Now, the preferred embodiments of the present invention will be described in detail with reference to the accompanying drawings.

[Embodiment 1]

Figure 5:
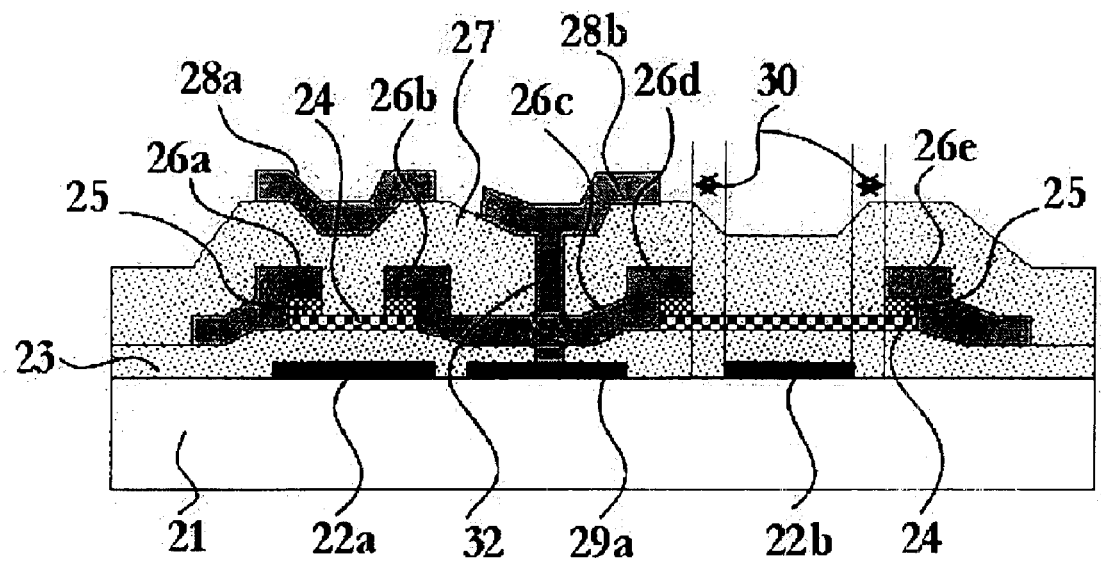
FIG. 5 is a cross sectional view illustrating the first embodiment of the present invention.

FIG. 5 is a cross-sectional view illustrating an image senor according to the first embodiment of the present invention on which offset regions are formed without any overlapping between a gate electrode and both-side electrodes of an optical sensor. Herein, the 'both-side electrodes' are a pixel electrode 26d and a power source electrode 26e of the optical sensor.

In the amorphous silicon thin-film transistor image sensor manufactured in accordance with the first embodiment, a gate electrode 22a of a switching thin-film transistor, a lower common electrode 29a, and a gate electrode 22b are formed in parallel to be separated from each other on an insulating substrate 21. The electrodes 22a, 29a, 22b are formed by depositing a metal having a thickness of 100 nm to 300 nm above the insulating substrate 21 by a DC sputtering method or a radio frequency sputtering method, performing an patterning thereof, and performing an etching thereof.

In addition, a gate insulating film 23 having a thickness of 50 nm to 500 nm is deposited above the first and second gate electrodes 22a, 22b and the lower common electrode 29a. An intrinsic amorphous silicon layer 24 having a thickness of 100 nm to 500 nm is deposited above the gate insulating film 23. An N type amorphous silicon layer 25 having a thickness of 20 nm to 100 nm is deposited above the intrinsic amorphous silicon layer 24. The detailed formation procedures are as follows.

At this time, the insulating film and the silicon layers are formed by the plasma enhanced chemical vapor deposition (PECVD) method at the temperature of 200° C. to 350° C. On the other hand, the intrinsic amorphous silicon layer 24 and the N type amorphous silicon layer 25 are patterned at the same time by a photolithography process.

Next, a drain electrode 26a and a source electrode 26b of the switching thin-film transistor, a connection portion 26c, a pixel electrode 26d and a power source electrode 26e are formed above the gate insulating film 23, at the side portions of the intrinsic silicon layer 24, and above the N type amorphous silicon layer. The formation procedure is carried out by depositing a metal having a thickness of 100 nm to 500 nm by a sputtering method and then patterning thereof.

On the other hand, in order to remove the N type amorphous silicon layer 25 which exists in channels of the switching thin-film transistor and the optical sensor, the N type amorphous silicon layer 25 is etched by using the drain electrode 26a, the source electrode 26b, the pixel electrode 26d, the power source electrode 26e as a mask.

Next, a protective insulating film 27 is formed above the electrodes 26a, 26b, 26d, 26e and the connection portion 26c in order to protect the devices. The protective insulating film 27 is made up of a silicon nitride film having a thickness of 200 nm to 500 nm and formed by the plasma enhanced chemical vapor deposition method.

After the formation procedure of the protective insulating film, a via hole 32 is formed to pass through the protective insulating film by using the photolithography method. The via hole 32 also passes through the connection portion 26c to be connected to the lower common electrode 29a. The via hole 32 is formed in order to increase the storage capacitance and facilitate formation of a pad contact.

In addition, a light shielding film 28a, a pad cover (not shown in the figure), and an upper common electrode 28d are formed by depositing a conductive metal having a thickness of 100 nm to 500 nm above the protective insulating film 27 and patterning thereof. Next, the pad cover film is connected upwards and downwards to the pad (not shown in the figure) through the via hole 32, and the light shielding film 28a is disposed to be separated from the left side of the upper common electrode 28b and the pad cover film. The light shielding film 28a is used to block a light leakage current of the switching thin-film transistor, and the upper common electrode 28b is used to increase the storage capacitance.

The pad is a portion for connection to an external circuit, and the pad cover film is formed at the same time when the upper common electrode 28d is formed.

In the first embodiment, the offset regions 30 are formed between a line passing at a right end of the pixel electrode 26d and a line passing at a left end of the second gate electrode 22b and between a line passing at a left end of the power source electrode 26e and a line passing at a right end of the second gate electrode 22b, respectively.

[Embodiment 2]

Figure 6:
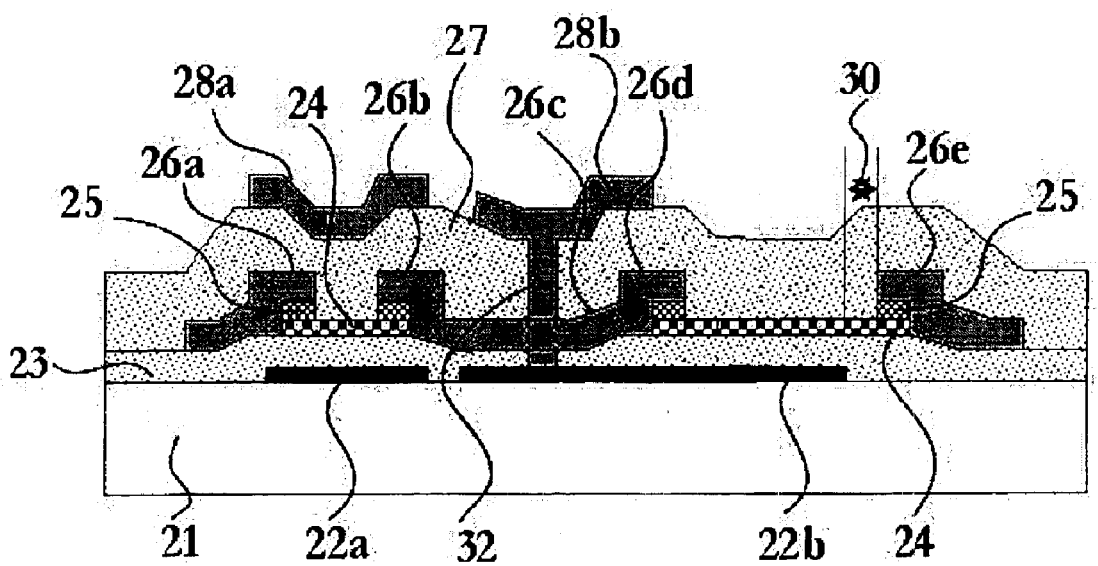
FIG. 6 is a cross sectional view illustrating the second embodiment of the present invention.

FIG. 6 is a cross-sectional view illustrating an image senor according to the second embodiment of the present invention on which an offset region is formed to have an overlapping between an pixel electrode 26d and a second gate electrode 22b without any overlapping between a power source electrode 26e and the second gate electrode 22b.

In the second embodiment, the offset region 30 is formed between a line passing at a left end of the power source electrode 26e and a line passing at a right end of the second gate electrode 22b.

In order to form the overlapping between the pixel electrode 26d and the second gate electrode 22b, the gate electrode 22b and the lower common electrode 29a of the first embodiment are formed with a common metal. In other words, the second gate electrode is used as the lower common electrode.

In addition, a via hole is formed to be connected to an upper common electrode 28b, a connection portion 26c, and the second gate electrode 22b. The formation procedures except the above-mentioned processes are the same as those of the first embodiment, and therefore, the detailed description thereof is omitted herein.

[Embodiment 3]

Figure 7:
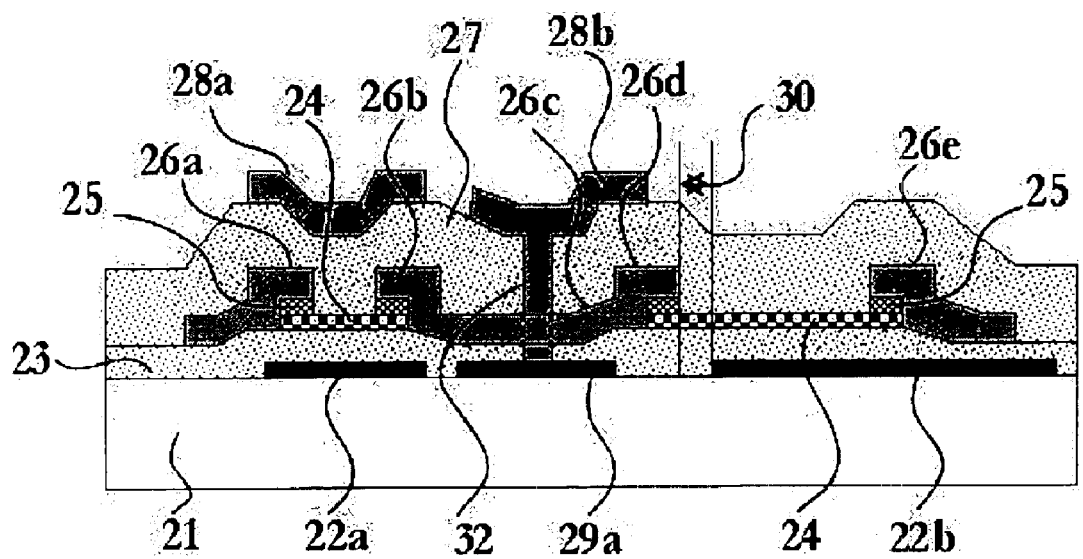
FIG. 7 is a cross sectional view illustrating the third embodiment of the present invention.

FIG. 7 is a cross-sectional view illustrating an image senor according to the third embodiment of the present invention on which an offset region is formed without any overlapping between a pixel electrode 26d and a second gate electrode 22b and an overlapping between a power source electrode 26e and the second gate electrode 22b is formed.

In the third embodiment, the offset regions 30 is formed between a line passing at a right end of the pixel electrode 26d and a line passing at a left end of the second gate electrode 22b.

In the third embodiment, the formation procedure except that the second gate electrode 22b is formed to be overlapped by the power source electrode laminated above the second gate electrode are the same as those of the first embodiment, and therefore, the detailed description thereof is omitted herein.

[Embodiment 4]

Figure 8:
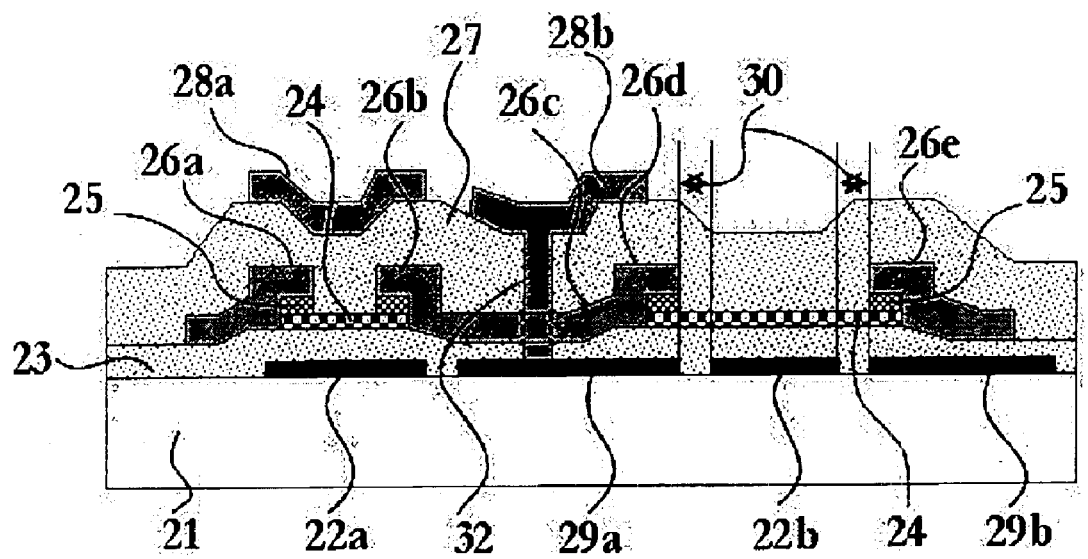
FIG. 8 is a cross sectional view illustrating the fourth embodiment of the present invention.

FIG. 8 is a cross-sectional view illustrating an image senor according to the fourth embodiment of the present invention on which an offset regions are formed and an overlapping between a pixel electrode 26d and a second gate electrode 22b and another overlapping between a power source electrode 26e and the second gate electrode 22b are formed.

In the fourth embodiment, the offset regions 30 are formed between a line passing at a right end of the pixel electrode 26d and a line passing at a left end of the second gate electrode 22b and between a line passing at a left end of the power source electrode 26e and a line passing at a right end of the second gate electrode 22b, respectively.

In the fourth embodiment, a first gate electrode 22a, a first lower common electrode 29a, the second gate electrode 22b, and the second lower common electrode 29b are formed to be separated from each other. In addition, the first lower common electrode 29a is formed to be overlapped by the pixel electrode 26d and the second lower common electrode 29b is formed to be overlapped by the power source electrode 26e. The formation procedures except the above-mentioned processes are the same as those of the first embodiment, and therefore, the detailed description thereof is omitted herein.

On the other hand, the present invention may be adapted to an etching-stopper type thin-film transistor as well as a normal-staggered type thin-film transistor. The process of manufacturing the etching-stopper type thin-film transistor is as follows.

The process before the deposition of the intrinsic amorphous silicon layer is the same as that of the inverse-staggered type thin-film transistor. After the deposition of the intrinsic amorphous silicon layer, an etching stopper which is made up of a silicon nitride film having a thickness of 20 nm to 100 nm is deposited, and then, channel regions are patterned by using a photolithography process. After that, an N type amorphous silicon layer, a drain electrode, a source electrode, a connection portion, and a pixel electrode and a power source electrode of the optical sensor are formed by deposition. The process is carried out by depositing a metal having a thickness of 100 nm to 500 nm by a sputtering method and patterning thereof. The formation procedures after the process are the same as those of the inverse-staggered type thin-film transistor.

On the other hand, the image sensor is mainly divided into a switching thin-film transistor and an optical sensor in structure. The switching thin-film transistor comprises a gate electrode, an intrinsic amorphous silicon layer, an N type amorphous silicon layer, a drain electrode, a source electrode, a protective insulating film, a light shielding film, etc. The structure of the optical sensor is the same as that of the switching thin-film transistor except that the optical sensor has no light shielding.

An upper common electrode is electrically connected to a lower common electrode through a via hole. In the source electrode 26b and the pixel electrode 26d between the common electrodes, storage capacitors are formed upwards and downwards from the source electrode 26b and the pixel electrode 26d. Therefore, the storage capacitance in the image sensor of the present invention is twice as large as that of the conventional amorphous silicon thin-film transistor image sensor.

Figure 9:
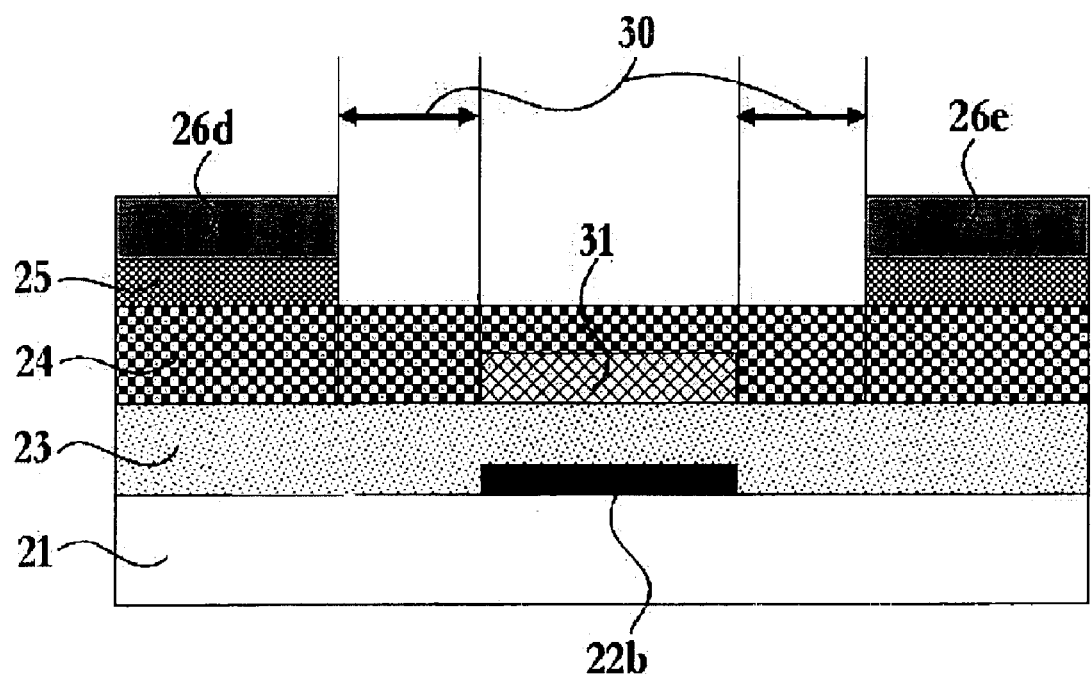
FIG. 9 is a schematic view illustrating a region in which holes are accumulated at the time that a negative voltage is applied to a gate electrode according to the first embodiment of the present invention.

FIG. 9 is a schematic view illustrating a region in which holes are accumulated at the time that a negative voltage is applied to a gate electrode of a thin-film transistor optical sensor according to the first embodiment of the present invention. When the negative voltage is applied to the gate electrode 22b of the optical sensor, the upper portion of the gate electrode 22b in the intrinsic amorphous silicon layer 24 is converted into a portion having properties of a P type amorphous silicon 31 due to accumulation of holes, and the offset region 30 preserves properties of the intrinsic amorphous silicon layer 24 continuously.

By doing so, an N-I-P-I-N contact is formed together with an N type amorphous silicon 25. Most of voltages are applied to the region, having properties of the intrinsic semiconductor, which is disposed between N type and P type layers. Therefore, the strong electric field which has been formed in the N type and P type layers is reduced so that the dark leakage current can remain in a low level even under a high voltage.

Figure 10:
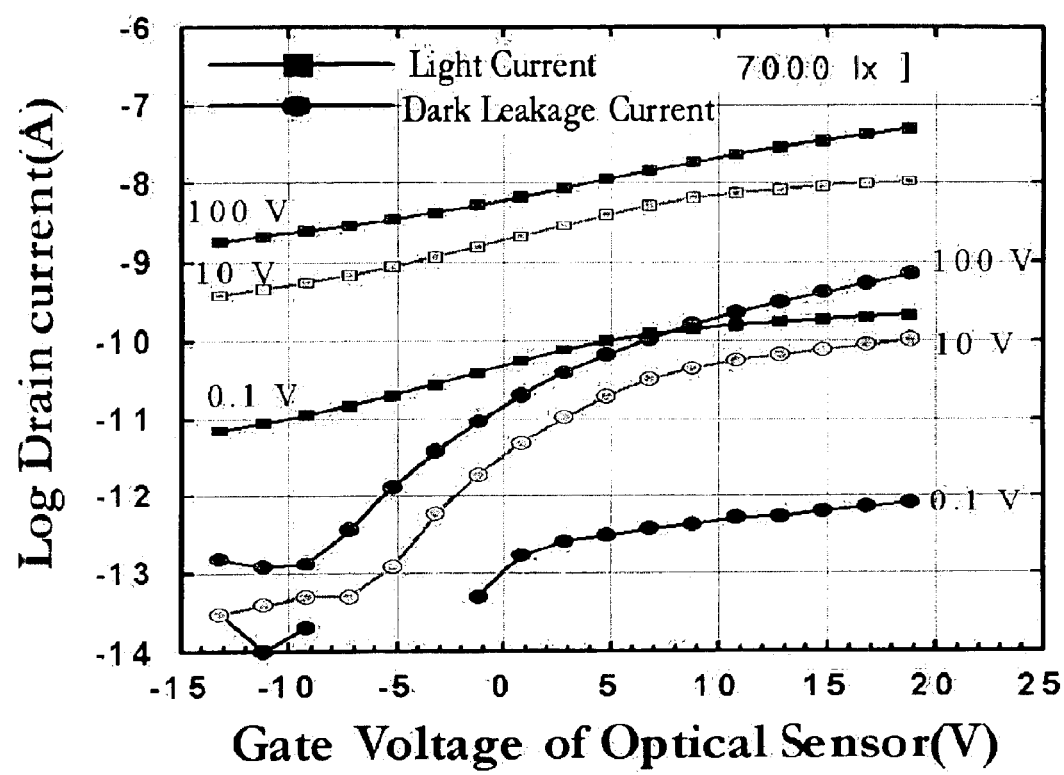
FIG. 10 is a graph illustrating a relationship between a drain current and a dark leakage current at the time that light is incident on the image sensor comprising the thin-film transistor optical sensor according to the present invention.

On the other hand, FIG. 10 is a graph illustrating a relationship between a drain current and a dark leakage current at the time that light is incident on each of gate electrodes of the thin-film transistor optical sensors according to the embodiments of the present invention In case of the embodiments of the present invention, even though the power source voltage of the optical sensor is increasing up to the level of 100V under the gate voltage of the optical sensor of −15V to −5V, the dark leakage current of the optical sensor remains in a low level of about $10^{-12}$ A. Therefore, even in the case that a high power source voltage is needed to obtain a high response speed, the dark leakage current of the optical sensor can remain in a low level so that it is possible to obtain high quality of image.

Industrial Availability

As described above, the image sensor according to the present invention has an advantage that the dark leakage current can remain in a level of $10^{-12}$ A or less, and thus, the dynamic range can be wide.

In addition, the image sensor according to the present invention has another advantage that, since the light current generated from the image sensor is the same as that of the conventional image sensor, the image sensor can be suitably used as an image sensor of a fingerprint recognition apparatus or an X-ray photography device.

In addition, the image sensor according to the present invention has still another advantage that it is possible to obtain an effect of reducing the electrostatic impact by electrically connecting the lower common electrode and the upper common electrode.

In addition, the image sensor according to the present invention has further still another advantage that, since the image sensor has an excellent electric strength and a low leakage current in comparison to any conventional image sensors, the image sensor can be widely adapted to scientific and commercial fields.

On the other hand, although the present invention and its advantages have been described in details, it should be understood that the present invention is not limit to the aforementioned embodiment and the accompanying drawings and it should be understood that various changes, substitutions and alterations can be made herein by the skilled in the arts without departing from the sprit and the scope of the present invention as defined by the appended claims.

What is claimed is:

1. An image sensor comprising:
   a switching thin film transistor;
   an optical sensor; and
   a connection portion for connecting the switching thin film transistor and the optical sensor,
   wherein at least one offset region is formed between a pixel electrode and a power source electrode in the optical sensor, and
   wherein the offset region is formed so that a second gate electrode is not overlapped by the pixel electrode or the power source electrode.

2. An image sensor according to claim 1, wherein the offset regions are formed between a line passing at a right end of the pixel electrode and a line passing at a left end of the second gate electrode and between a line passing at a left end of the power source electrode and a line passing at a right end of the second gate electrode, respectively.

3. An image sensor according to claim 1, wherein the offset region is formed between a line passing at a left end of the power source electrode and a line passing at a right end of the second gate electrode.

4. An image sensor according to claim 1, wherein the offset regions are formed between a line passing at a right end of the pixel electrode and a line passing at a left end of the second gate electrode.

5. An image sensor according to claim 3, wherein the second gate electrode is used as a lower common electrode.

6. An image sensor according to anyone of claims 1 to 5, wherein a length of the offset region is in a range of 1 um to 10 um.

7. An image sensor according to anyone of claims 1 to 5, wherein the optical sensor is an amorphous silicone thin film transistor optical sensor.

* * * * *